United States Patent
Rohatgi

[19]

[11] Patent Number: 5,841,953
[45] Date of Patent: *Nov. 24, 1998

[54] METHOD FOR COMPRESSING AND DECOMPRESSING DATA FILES

[75] Inventor: Pankaj Rohatgi, Los Angeles, Calif.

[73] Assignee: Thomson Consumer Electronics, Inc., Indianapolis, Ind.

[*] Notice: This patent issued on a continued prosecution application filed under 37 CFR 1.53(d), and is subject to the twenty year patent term provisions of 35 U.S.C. 154(a)(2).

[21] Appl. No.: 674,302

[22] Filed: Jul. 1, 1996

Related U.S. Application Data

[63] Continuation of Ser. No. 283,346, Aug. 1, 1994.

[51] Int. Cl.[6] .................................................. G06F 15/00
[52] U.S. Cl. ............................................. 395/114; 395/109
[58] Field of Search .................................... 395/101, 105, 395/109, 114, 377, 382, 384, 385, 112, 113, 115, 117; 358/261.1, 261.2, 261.3, 433; 382/232, 233, 234, 235, 236, 238, 239, 244, 245, 248; 341/51, 58, 59, 60

[56] References Cited

U.S. PATENT DOCUMENTS

| | | | |
|---|---|---|---|
| 4,494,151 | 1/1985 | Liao | 358/261.1 |
| 4,876,541 | 10/1989 | Storer | 341/51 |
| 4,888,645 | 12/1989 | Mitchell et al. | 358/261.1 |
| 5,018,060 | 5/1991 | Gelb et al. | 395/621 |
| 5,049,881 | 9/1991 | Gibson et al. | 341/95 |
| 5,108,207 | 4/1992 | Isobe et al. | 400/70 |
| 5,109,433 | 4/1992 | Notenboom | 382/229 |
| 5,168,356 | 12/1992 | Acampora et al. | 358/133 |
| 5,197,117 | 3/1993 | Kato et al. | 395/105 |
| 5,212,565 | 5/1993 | Feintuch et al. | 358/433 |
| 5,382,968 | 1/1995 | Endoh | 347/112 |
| 5,394,534 | 2/1995 | Kulakowski et al. | 395/439 |
| 5,513,301 | 4/1996 | Wakasu | 395/114 |
| 5,586,093 | 12/1996 | Honda et al. | 369/32 |

FOREIGN PATENT DOCUMENTS

| | | | |
|---|---|---|---|
| 637 174 A2 | 2/1995 | European Pat. Off. | H04N 7/24 |
| 649 259 A2 | 4/1995 | European Pat. Off. | H04N 7/24 |
| 660 614 A1 | 6/1995 | European Pat. Off. | H04N 7/24 |

*Primary Examiner*—David K. Moore
*Assistant Examiner*—Gabriel I. Garcia
*Attorney, Agent, or Firm*—Joseph S. Tripoli; Eric P. Herrmann; Ronald H. Kurdyla

[57] ABSTRACT

A method is disclosed for decompressing in-place an adjusted monotone compressed file having a first portion containing compression codewords and a second portion containing plain text, into a decompressed file having a size and containing plain text. The method comprising the following steps. First, a memory buffer is allocated having the size of the decompressed file. Then the adjusted monotone compressed file is stored in the bottom of the buffer. Finally, the compression codewords in the first portion of the adjusted monotone compressed file are decompressed to produce plain text of a corresponding portion of the decompressed file in the top of the buffer. A method is also disclosed for compressing a source file into an adjusted monotone compressed file. The method comprises the following steps. First, the source file is monotone compressed into a compressed file containing compression codewords. Then the compressed file is adjusted to produce an adjusted monotone compressed file having a first portion containing compression codewords and a second portion containing plain text.

6 Claims, 4 Drawing Sheets

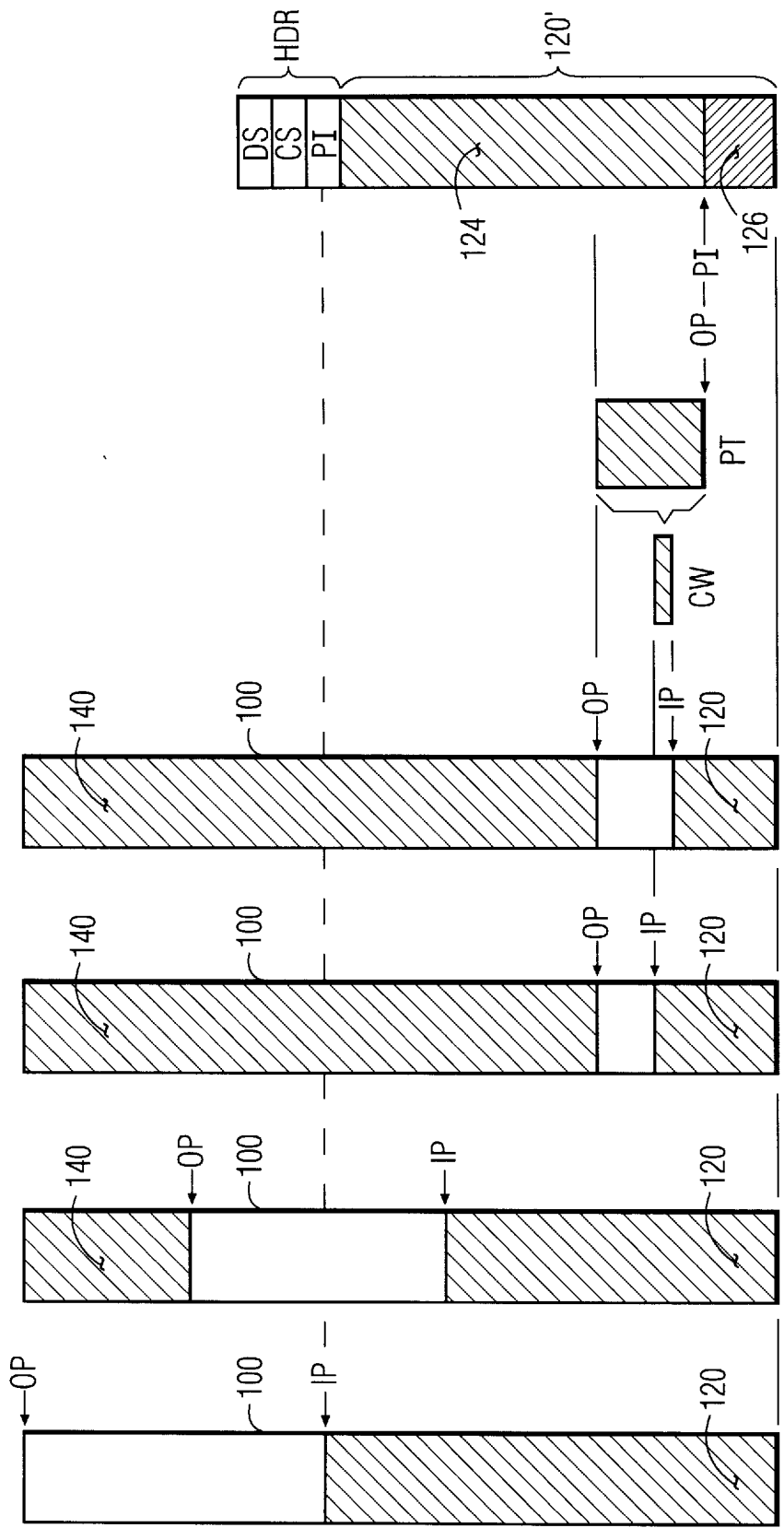

METHOD FOR COMPRESSING AND DECOMPRESSING DATA FILES

This is a continuation of application Ser. No. 08/283,346, filed Aug. 1, 1994.

The present invention relates to a method for compressing and decompressing data files in a system in which compression is performed off-line, and decompression is performed in real time and in a system with memory constraints, such as an audio video interactive system.

BACKGROUND OF INVENTION

An audio video interactive (AVI) system is a broadcast interactive system providing means by which a viewer may interact with a television program. In this system, each receiving location contains a processor which receives an AVI application program from a transmitting location via an AVI signal. The AVI signal is a composite signal containing an audio and a video component, like a standard television signal; and also an interactive component, which carries code and data modules making up the application program. An application programmer generates the code and data modules off-line using standard programming tools, such as compilers, etc. These code and data modules are then processed into the interactive component, which is combined with the audio and video components to form the AVI signal.

The AVI composite signal is transmitted to the receiving location. The audio and video components are extracted from the AVI composite signal, and processed to generate sounds and images in a known manner, such as in a normal television system. The interactive component is extracted, and the code and data modules are loaded into the memory of the processor at the receiving location. The processor then executes the code modules and processes the data modules to possibly generate sounds and graphic images to be overlaid upon the AVI audio sound and video image, respectively, and respond to input from the viewer to interact with the television programming.

It is envisioned that the receiving location equipment will be made and sold at a relatively low-cost. The cost will be lowered by minimizing the amount of memory contained in each processor, and by using a microprocessor having relatively low computing power, such as an SGS/Thomson ST9.

It is further envisioned that the application program will be partitioned into a number of relatively small code and data modules (typically less than 32 kB). In order to optimize the bandwidth available in the interactive component, the code and data modules will be compressed before they are transmitted. Because the modules are small, and compression is to be done offline, compression speed is of minimal concern. On the other hand, decompression speed has to be fast even on a relatively low computing power microprocessor, such as the SGS/Thomson ST9 (a microprocessor not suited for decompression because it has limited bit shifting abilities, e.g. only single bit shifts). In addition, there is a relatively minimal amount of RAM provided for storage and execution of the application program in the receiving location processor. Thus, any decompression method used is required to use minimal memory.

Prior art compression techniques include the Lempel-Ziv '77 family of compression algorithms. These compression techniques are based on the basic idea that very often there are repetitions in source data. Compression can be achieved by replacing a repetition with a special codeword containing a pointer to an earlier occurrence (termed a back pointer) and possibly the size of the match. For example, the source string "abcdabcf", could be coded in the following manner:

Copy characters 'a', 'b' and 'c' to output;
Copy a match of size 3, starting 4 bytes behind the current output position to output;
Copy character 'f' to output.

A source data file which is compressed using this technique may be decompressed by traversing the compressed file from beginning to end, without requiring any backtracking and rereading of previously read compressed data. In addition, the decompressed data is also output sequentially even though the decompression process normally requires access to previously decompressed data. A compression technique which may be decompressed in this manner is termed a monotone compression/decompression technique.

SUMMARY OF THE INVENTION

The inventor has realized that further compression may be achieved by using overlapping matches. An overlapping match is one in which the next portion of the source file data to be encoded is included in the repetition being encoded. For example, the source string "abcabcabc" may be encoded, using overlapping matches, in the following manner:

Copy characters 'a', 'b' and 'c' to output;
Copy a match of size 6, starting 3 bytes behind the current output position to output.

In other words, the six character string starting at the beginning of the above string matches the six character string beginning at the second 'abc', i.e. after the first 'abc' has been encoded. By using overlapping matches, the size of a compressed file may be made smaller than by not using overlapping matches. The decompressor is constructed to process an encoded repetition by copying characters one at a time from the initial location of the repetition to the next location in the output file.

To minimize the size of the compressed file, current compression techniques optimize the composition of the codewords which indicate that a character is to be directly copied and the special codewords which contain the back pointers and match sizes to an earlier occurrence, by varying the size of these codewords. In general, among the characters that will copied over directly, some characters are likely to appear more frequently than others. Also, examination of the back-pointers and match sizes generated for typical data shows that the number of matches of a given size decreases almost exponentially from a size of two to around six or seven and then the decrease is much less rapid. Similarly, there are many more small back pointers (indicating that the matching pattern is close to the current position) than large ones, due to the locality of reference in repetitions. Current compression techniques exploit this skewed distribution of back pointers and match sizes by encoding the special codewords, and the unmatched input strings, using entropy coding in which the size of the codewords are continuously varied.

The inventor has realized that using true variable length secondary compression (entropy encoding) for the special codewords containing the back pointers and match pointers and the copy character codewords is not suitable in an AVI system for two reasons. First, decompression of such data will require extensive use of bit-shifts because codewords will not respect byte boundaries. This will be a bottleneck for relatively low processing power microprocessors such as the ST9 which can perform only a one position shift at a time. It would require a major effort on the part of the decompressing routine to minimize time spend in performing variable shifts and rotates. Second, fast decompression of true variable length codewords requires building and maintaining lookup tables in the decompressor. The decompressor must use computing time to build these lookup tables and space in system RAM must be allocated to store the lookup tables. Because there is only a minimal amount of system RAM in the AVI decoder (one of the reasons why data is sent compressed in the first place) there is insufficient system RAM space to build large enough lookup tables to make the decoding of the variable length codes fast enough.

The main goal, therefore, is fast decompression while requiring a minimum of system RAM space. In accordance with an aspect of the present invention, the compressed data is represented by restricted variable length codewords. That is codewords are restricted to lengths which are multiples of a nibble (4 bits), instead of having a true variable length coding. Such a scheme allows for a certain amount of optimization of the length of the codewords without requiring the large number of shift and rotate operations which true variable length codewords would require.

In current decompression procedures, the compressed file is written into a first memory buffer. A second memory buffer is then allocated to contain the decompressed source file. Then the compressed file in the first memory buffer is traversed, and the reconstructed source data file is written into the second memory buffer. Such techniques require that two memory buffers be allocated in order to decompress the compressed file.

The inventor has utilized the principle of monotone compression/decompression techniques to permit a compressed file to be decompressed in-place. That is, when the compressed file is received, a single buffer in memory sufficient in size to contain the decompressed source file is allocated. The compressed file is written into that buffer. Then the compressed file is. decompressed into the source file all within the single memory buffer. This obviates the requirement for a separate buffer to hold the compressed file, minimizing memory requirements for decompression.

In accordance with principles of the present invention, a method for decompressing in-place an adjusted monotone compressed file having a first portion containing compression codewords and a second portion containing plain text, into a decompressed file having a size and containing plain text comprises the following steps. First, a memory buffer is allocated having the size of the decompressed file. Then the adjusted monotone compressed file is stored in the bottom of the buffer. Finally, the compression codewords in the first portion of the adjusted monotone compressed file are decompressed to produce plain text of a corresponding portion of the decompressed file in the top of the buffer.

A method for compressing a source file into an adjusted monotone compressed file comprises the following steps. First, the source file is monotone compressed into a compressed file containing compression codewords. Then the compressed file is adjusted to produce an adjusted monotone compressed file having a first portion containing compression codewords and a second portion containing plain text. A source file compressed in accordance with the invention results in an adjusted compressed file having the same size as the original compressed file.

BRIEF DESCRIPTION OF THE DRAWINGS

In the drawing:

FIG. 5 and FIG. 6 are memory diagrams useful in understanding the adjustment made to a compressed file to allow for inplace decompression.

DETAILED DESCRIPTION

Figure 1:
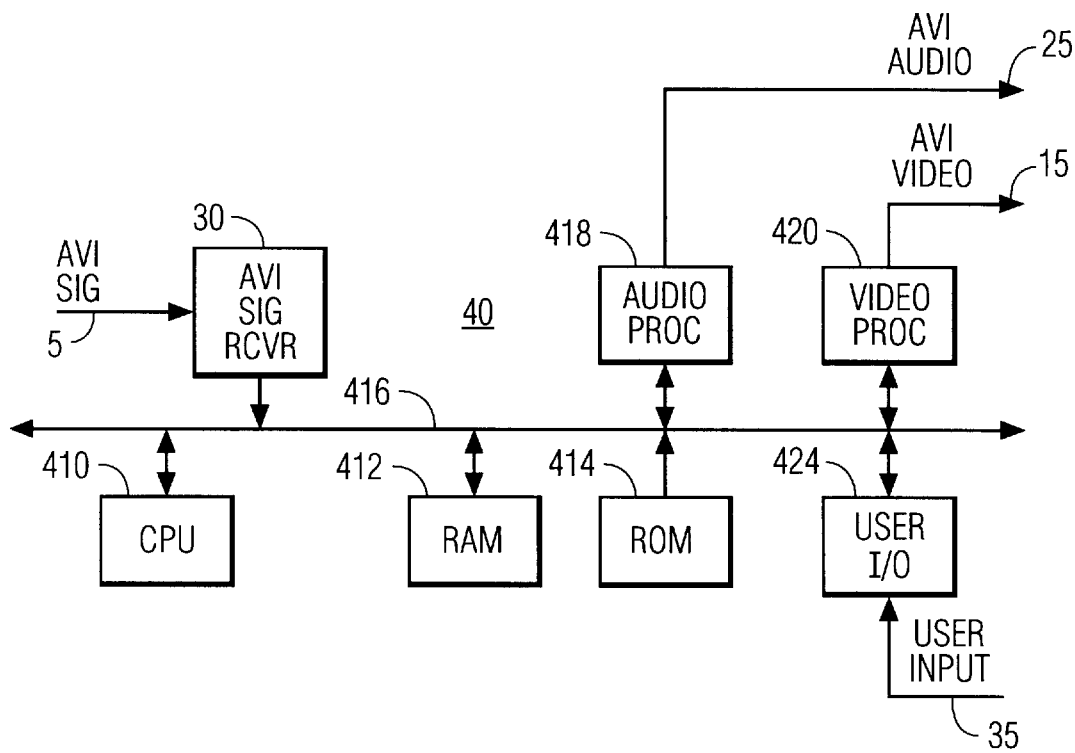
FIG. 1 is a block diagram of a portion of an AVI signal decoder, incorporating the present invention.

FIG. 1 is a block diagram of a portion of an AVI signal decoder, incorporating the present invention. A decoder as illustrated in FIG. 1 is installed in each AVI receiving location. In FIG. 1, a source of an AVI signal (not shown) is coupled to an input terminal 5 of the decoder. Input terminal 5 is coupled to an input terminal of an AVI signal receiver 30. An output terminal of the AVI signal receiver 30 is coupled to a system bus 416 of a processing unit 40. Processing unit 40 includes a central processing unit (CPU) 410, such as the SGS/Thomson ST9 microprocessor; a read/write memory (RAM) 412 and a read-only memory (ROM) 414 coupled together in a known manner via the system bus 416.

An audio processor 418, which provides an audio signal to an AVI audio output terminal 25; a video processor 420, which provides a video signal to an AVI video output terminal 15 and a user I/O adapter 424, which receives data from a user via an input terminal 35, are all also coupled to the system bus 416 in a known manner. Other equipment, e.g. I/O ports to collocated computers, modems, math processors, other I/O adapters, etc., may also be coupled to system bus 416 in a known manner, and a bus extender may be included for coupling to other equipment in enclosures external to the decoder enclosure.

In operation, the AVI signal source, which, for example, may be a direct RF satellite link, a cable system feed or a fiberoptic link to the decoder, produces an AVI signal, in the form of a stream of packets. Some of the packets carry the audio component of the AVI signal, others carry the video component, and still others carry the interactive component. The AVI signal receiver 30 processes the received AVI signal to extract the packets forming the audio, video and interactive components, and store the data they contain in respective previously specified memory buffers in the RAM 412 using known DMA write techniques. The audio processor 418 and video processor 420 then read the data from their respective memory buffers in RAM 412, using known DMA read techniques. Audio processor 418 and video processor 420 then process their data to produce the AVI audio signal at output terminal 25, and the AVI video signal at output terminal 15, respectively. It is also possible for CPU 410 to cooperate with the video processor 420 and/or audio processor 418 in their processing. The interactive component packets carry the code and data modules, and are processed under the control of the CPU 410 in a manner described below.

Figure 2:
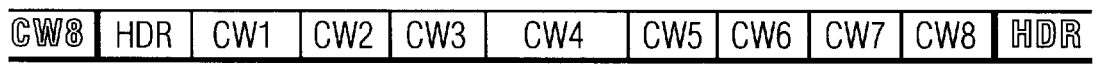
FIG. 2 is a memory layout diagram illustrating the structure of the codewords representing source data in a file compressed in accordance with a preferred embodiment of the present invention.

As described above, in order to maximize the bandwidth of the interactive component, an application programmer may decide to compress the code and/or data modules using a monotone compression technique, such as the Lempel-Ziv '77 technique, before including them in the interactive component of the AVI signal. In addition, overlapping matches may be used to provide further compression of the modules. FIG. 2 is a memory layout diagram illustrating the structure of the codewords representing source data in a file compressed in accordance with a preferred embodiment of the present invention. In the preferred embodiment, the compressed file is in the form of successive blocks of codewords. Each block includes a 1 code-byte header HDR followed by 8 codewords (CW1–CW8).

Figure 3:
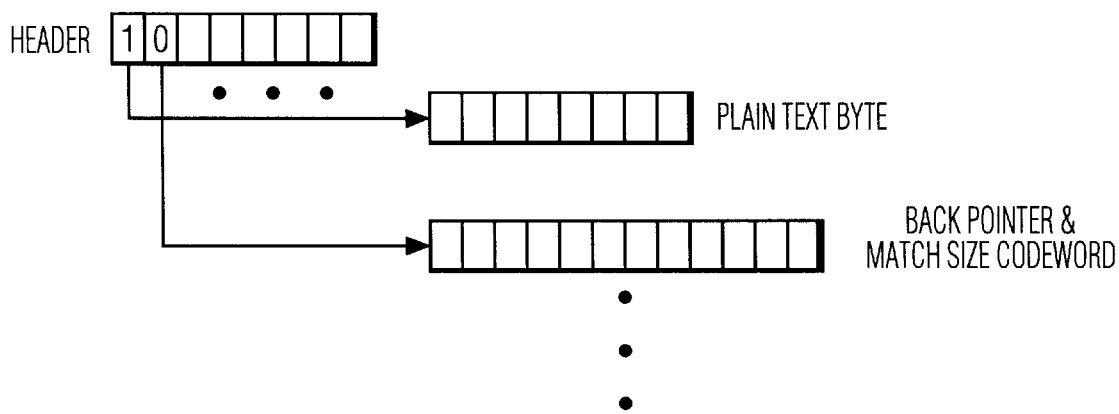
FIG. 3 is a more detailed memory layout diagram illustrating the relationship between the header HDR and codewords (CW1–CW8) in FIG. 2.
Figure 4A:
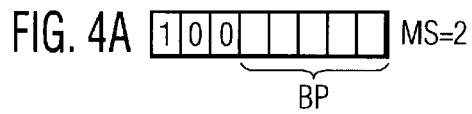
FIG. 4a to FIG. 4j are more detailed memory layout diagrams illustrating respective formats of codewords representing back pointer/match sizes.
Figure 4B:
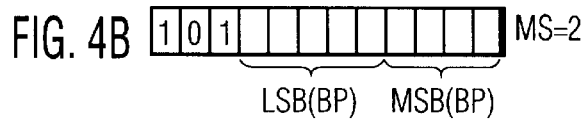
Figure 4C:
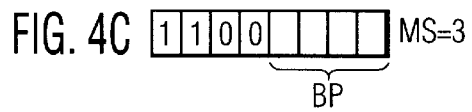
Figure 4D:
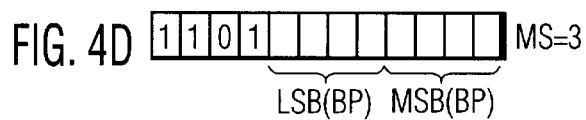
Figure 4E:
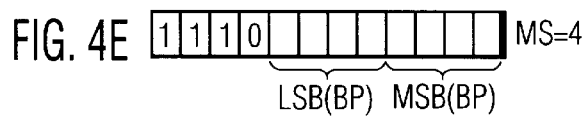
Figure 4F:
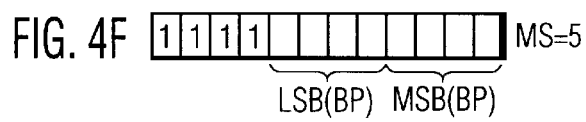
Figure 4G:
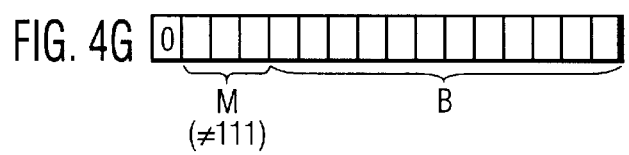
Figure 4H:
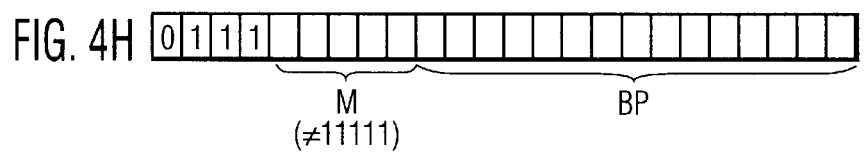
Figure 4I:
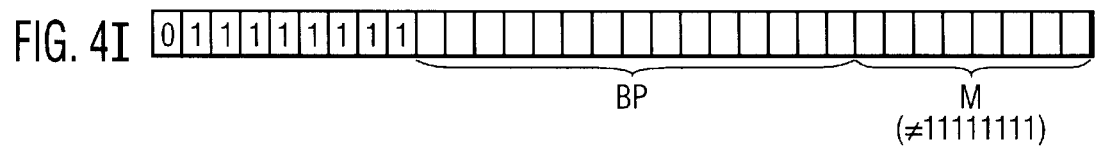
Figure 4J:
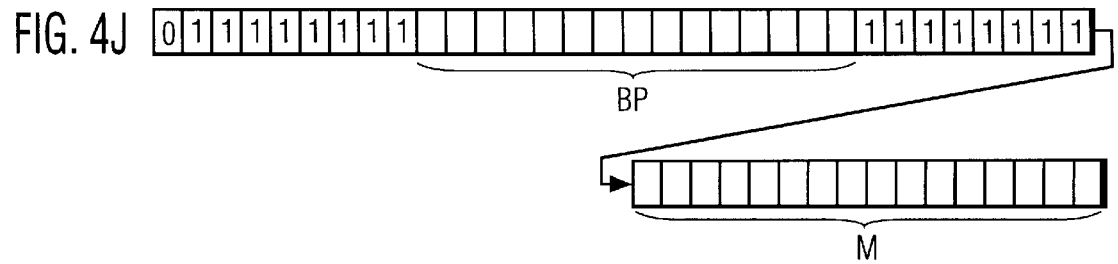

FIG. 3 is a more detailed memory layout diagram illustrating the relationship between the header HDR and codewords (CW1–CW8) in FIG. 2. The one code-byte header contains respective bit flags for each codeword, and codewords are consecutive, illustrated in FIG. 3 by arrows from the first bit of the header to the first codeword and from the second bit of the header to the second codeword. If a bit in the header is 1, then the corresponding codeword is a code-byte representing an uncompressed byte of data which should be copied over to the decompressed file during decompression. If a bit in the header is 0, then the corresponding codeword is a back pointer/match size codeword.

FIG. 4a to FIG. 4j are more detailed memory layout diagrams illustrating respective formats of codewords representing back pointer/match sizes. As described above, the codewords are variable in length, but are restricted to multiples of a nibble (4 bits). In FIG. 4, the length of the codeword (i.e. the number of nibbles), the value of the back pointer and the match size are determined as follows. If the first bit is 1, then the codeword is either a 2 or a 3 nibble codeword. If the second bit is 0 then the match size is 2. If the third bit is 0 (FIG. 4a) then it is a 2 nibble codeword and the next 5 bits represents the back pointer (BP)−1. If the third bit is 1 (FIG. 4b) then it is a 3 nibble code and the next five bits represents the least significant bits (LSB) and the next nibble represents the most significant bits (MSB) of the back pointer (BP)−1.

If the second and third bits are 10 then the match size is 3. If the fourth bit is 0 (FIG. 4c) then it is a 2 nibble codeword and the next 4 bits represent the back pointer (BP)−1. If the fourth bit is 1 (FIG. 4d) then it is a 3 nibble codeword and the next 4 bits represent the least significant bits (LSB) and the next nibble represents the most significant bits (MSB) of the back pointer (BP)−1. If the second, third and fourth bits are 110, respectively (FIG. 4e), then the match size is 4 and the codeword size is 3 nibbles. The next 4 bits represent the least significant bits (LSB) and next nibble represents the most significant bits (MSB) of the back pointer (BP)−1. If the second, third and fourth bits are 111, respectively (FIG. 4f), then the match size is 5 and the codeword size is 3 nibbles. The next 4 bits represent the least significant bits (LSB) and next nibble the most significant bits (MSB) of the back pointer (BP)−1.

If the first bit of the codeword is 0, the match size is encoded within the codeword. For these codewords, the match size and back pointer are determined in the following manner. If the second, third and fourth bits are not 111, respectively (FIG. 4g), then the codeword size is two code-bytes (four nibbles). In such a case, the second, third and fourth bits represent a value M. The match size is M+3. The remaining 12 bits (4 bits from the current code-byte and 8 bits from the next codebyte) represent a value B. The back pointer is B+1. If the second, third and fourth bits are 111, respectively, then the codeword is at least 3 code-bytes. If the next five bits are not 11111 (FIG. 4h) then the codeword consists of 3 code-bytes. The fifth, sixth, seventh, eighth and ninth bits represent a value M. The match size is M+3. The back pointer (BP) is the last 15 bits+1. This is the maximum allowed size for a back pointer i.e., 32K).

If the fifth, sixth, seventh, eighth and ninth bits are 11111, respectively, then the code is at least 4 code-bytes long. For such codewords, the back pointer is the value of the next 15 bits+1 (the same as in FIG. 4h). If the last code-byte is not 255 (i.e. 11111111), (FIG. 4i) then the last code-byte contains a value M. The match size is M+34. However, if this byte contains the value 255 (i.e. 11111111) (FIG. 4j), then the codeword is actually 6 code-bytes long. The back pointer (BP) is contained in the same position as in FIG. 4i. The last two codebytes (bytes 5 and 6) contain a value M. The match size is M+289.

This coding method uses smaller codewords for more common back pointer/match sizes, and only requires larger codewords for less common back pointer/match sizes. In addition, the lengths of all the codewords are multiples of a nibble. By limiting codeword lengths to multiples of a nibble, all codewords begin at either a byte-boundary in memory or at a nibble boundary within a byte in memory. Because many low-end microprocessors, such as the ST9, have instructions to swap the two nibbles in a byte, the codewords can be extracted efficiently without having to perform too many shifts. Moreover, because the compressor is aware of the of the positioning of codewords in memory, it encodes them in a way such that it is faster for the decompressing microprocessor to retrieve.

For example, if the code-byte X=b7.b6. . . b0 is to be placed at the nibble boundary within output byte Y, one way to place it in between output bytes Y and Y+1 would be:

$$Y=x.x.x.x.b7.b6.b5.b4 \quad Y+1=b3.b2.b1.b0.x.x.x.x \tag{1}$$

where x denotes a generic bit (i.e. it could be 0 or 1). Extracting the code-byte X would then involve reading a 16-bit word W from locations Y and Y+1:

$$W=x.x.x.x.b7.b6.b5.b4.b3.b2.b1.b0.x.x.x.x \tag{2}$$

and performing four bit-shift operations to the left (or right). But if the compressor had coded this code-byte as:

$$Y=x.x.x.x.b3.b2.b1.b0 \quad Y+1=b7.b6.b5.b4.x.x.x.x \tag{3}$$

then the code-byte could be extracted by reading a 16-bit word W from locations Y and Y+1:

$$W=x.x.x.x.b3.b2.b1.b0.b7.b6.b5.b4.x.x.x.x \tag{4}$$

performing a logical AND of W with the mask M:

$$M=0.0.0.0.1.1.1.1.1.1.1.1.0.0.0.0 \tag{5}$$

and adding, or logical ORing, the two bytes of the resulting 16-bit word. On the ST9, the time saved by this optimization is equivalent to removing two of the four bit shift operations in the previous method.

According to the present invention, the compressed file, compressed as described above, is adjusted to allow for in-place decompression. To perform this adjustment, the size of both the original source file and the compressed file is noted, and the compressed file is processed a second time.

Figure 5:
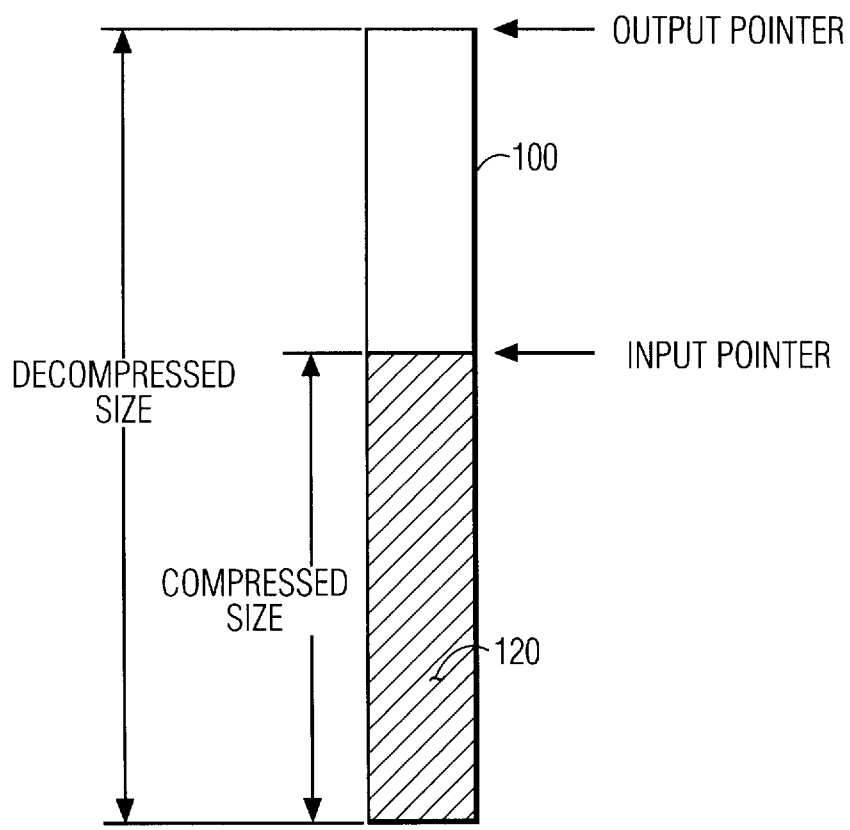

FIG. 5 and FIG. 6 are memory diagrams useful in understanding the adjustment made to a compressed file to allow for inplace decompression. In FIG. 5, a memory buffer 100 is illustrated as a vertically oriented rectangle. The total size of the buffer is sufficient to contain the decompressed file. To make the adjustment to the compressed file, the compression process continues processing the previously compressed file by attempting to perform a decompression in place, and monitoring the results of the attempt, in the following manner. The compressed file 120 is written into the bottom of the buffer 100, and is illustrated as a shaded rectangle in FIG. 5. An input pointer is set to point to the first location in the compressed file 120, and an output pointer is set to point to the first location in the memory buffer 100 into which the decompressed file will be written. As will be described in more detail below, during the adjustment phase of the compression process, data in the compressed file 120 is read from the location pointed to by the input pointer, and the input pointer advanced; and data is written into the top of the memory buffer 100 at the location pointed to by the output pointer, and the output pointer advanced, all in a known manner.

During the adjustment phase of the compression process, the compressed file 120 is decompressed using a standard monotone decompression process, while the states of the input and output pointers are monitored. FIG. 6 is a sequence of memory diagrams illustrating the progress of the decompression phase of the compression process. In FIG. 6, portions of the memory buffer 100 containing data are illustrated as shaded, and portions which do not contain data are illustrated as unshaded. FIG. 6a corresponds to FIG. 5 and illustrates the state of the memory buffer 100 at the beginning of the adjusting decompression process, with the input pointer (IP) set to point to the beginning of the compressed file 120 (shaded), and the output pointer (OP) set to point to the beginning of the memory buffer 100.

FIG. 6b illustrates the state of the memory buffer 100 just after the decompression process has begun. In FIG. 6b, a first portion of the compressed file 120 has been read, as indicated by the movement downward of the input pointer IP. Because there is no backtracking in a monotone compressed file during the decompression process, the portion of the memory buffer 100 already read will not be read again, and is available to hold data, illustrated as unshaded. At the same time, the first portion of the decompressed file 140 has been generated in response to the portion of the compressed file 120 already read. This first portion of the decompressed file 140 has been written into the top of the memory buffer 100 as indicated by the movement of the output pointer OP.

FIG. 6c illustrates the state of the memory buffer 100 when the decompression has progressed further. More of the compressed file 120 has been read as indicated by the location of the input pointer IP, and more of the decompressed source file has been generated, as indicated by the location of the output pointer OP. As can be seen in FIG. 6c, the location of the output pointer OP has nearly reached the location of the input pointer IP.

If the output pointer OP overtakes the input pointer IP, then it will be impossible to further decode the compressed file 120 because the newly written portion of the decompressed source file 140 will overwrite the portion of the compressed file 120 which is next to be read. FIG. 6d illustrates such a situation. In FIG. 6d, the next codeword is read from the compressed file 120, as indicated by the movement of the input pointer IP. This codeword is illustrated in FIG. 6e as a shaded rectangle CW. The illustrated codeword CW is a back pointer/match size codeword, which generates plain text PT, illustrated as a shaded rectangle in FIG. 6e. As can be seen, the size of the plain text PT is such that when written into buffer 100 at the location of the output pointer OP, it will overwrite the next portion of the compressed file 120 to be read. The output pointer (OP) will then point to the bottom of that newly written portion of the decompressed file, which is below the value of the input pointer (IP). It is this passing of the input pointer (IP) by the output pointer (OP) that the adjustment phase of the compression process is monitoring the input pointer (IP) and output pointer (OP) for.

In accordance with the present invention, the compressed file 120 is then adjusted in the following manner. The codewords in the compressed file 120 from the new location of the output pointer (OP) to the end of the compressed file are replaced with plain text from the uncompressed source file. The resulting adjusted compressed file 120' is illustrated in FIG. 6f. In FIG. 6f, the adjusted compressed file 120' includes a first portion 124 containing codewords representing a corresponding portion of the uncompressed source file, and a second portion 126 (illustrated by darker shading) containing data representing plain text of a corresponding portion of the uncompressed source file. The location in the adjusted compressed file 120' at which codewords stop and plain text begins is termed the plain index (PI), and is further noted. A header HDR is added to the beginning of the adjusted compressed file 120' containing (among other things) data representing the size of the decompressed file (DS), the size of the compressed file (CS) and the plain index (PI).

In a preferred embodiment, the above described adjustment process does not actually reconstruct the source file 140 from the compressed file 120, as is illustrated in FIG. 6. Instead, the reconstruction is only simulated. The compressed file 120 is traversed, and the input pointer (IP) and the output pointer (OP) are maintained exactly as they would be if an actual decompression were performed, but no decompressed file 140 is actually created. When the point is found where an adjustment need be made in the compressed file 120, then the compressed file 120 is rewritten as described above with codewords in the first portion 124 and plain text in the second portion 126. Then the header is added to the adjusted file 120'.

It should be noted that the length of the adjusted compressed file 120' is exactly the same as the originally generated compressed file 120 (illustrated by a dashed line from FIG. 6a to FIG. 6d). That is, this technique does not increase the size of the compressed file.

Decompression may be performed in-place by reading the header HDR of the received adjusted compressed file 120', allocating a buffer (100 of FIG. 6) the size (DS) of the decompressed file 140 in the RAM 412 (of FIG. 1) and storing the adjusted compressed file 120', without the header HDR, in the bottom of the buffer 100. The starting address for the adjusted compressed file 120' may be calculated from the sizes of compressed (CS) and decompressed (DS) files extracted from the header HDR. An input pointer (IP) is set to point to the beginning of the adjusted compressed file 120' in the buffer 100 and an output pointer (OP) is set to point to the beginning of the buffer 100. Then the standard monotone decompression technique is performed on the first portion 124 of the adjusted compressed file 120' using the input (IP) and output (OP) pointers in a similar manner to that illustrated in FIG. 6, until the value of the output pointer (OP) equals the plain index (PI). From that point, only plain text is contained in the adjusted compressed file 120' so no further decompression is necessary. If decompression of an adjusted compressed file 120' is performed using two buffers (i.e. not inplace), then when the output pointer (OP) in the decompressed file 140 reaches the plain index (PI), the input pointer (IP) is reset to also point to the plain index (PI) position in the adjusted compressed file 120', and the remainder of the adjusted compressed file 120' is copied to the decompressed file 140, unchanged.

What is claimed is:

1. In a system for receiving a compressed data file and then decompressing the compressed data file, a method for decompressing in-place an adjusted monotone compressed file having a first contiguous portion containing compressed codewords and a second contiguous portion containing plain text representing a portion of unadjusted compressed codewords, into a decompressed file having a size and containing plain text, said compressed data file including a header including at least file size information, said method comprising the steps of:

receiving said compressed file;

reading the header and determining decompressed file size and identifying said first and second contiguous portions;

allocating a memory buffer having the size of the decompressed file;

storing the adjusted monotone compressed file in a first block of allocated said memory buffer, and setting an input pointer to a location in the memory buffer corresponding to the beginning of the adjusted monotone compressed file;

decompressing the compressed codewords in the first contiguous portion of the adjusted compressed file to produce corresponding decompressed codewords and inserting respective decompressed codewords in a second block of allocated said memory buffer corresponding to a remaining portion of the allocated memory buffer not occupied by said monotone compressed file, and when said second block of allocated said memory buffer is filled, inserting decompressed codewords in said first block of allocated said memory buffer at memory locations previously occupied by compressed codewords that have been decompressed, and incrementing the input pointer after accessing respective compressed codewords; and halting decompression when said input pointer reaches the beginning of said second contiguous portion, at which time the entire compressed file will be decompressed.

2. The method of claim 1 wherein the decompressing step comprises steps of:

setting an output pointer to the beginning of the second block of the allocated memory buffer;

reading a codeword from the first block of the allocated memory buffer pointed to by the input pointer and advancing the input pointer;

decoding the codewords to produce plain text;

writing the plain text to a location in the second block of the allocated memory buffer pointed to by the output pointer and advancing the output pointer;

repeating the reading, decoding and writing steps until the output pointer corresponds to the location of the beginning of said second contiguous portion containing plain text, and then halting the decompression step.

3. The method of claim 1 wherein:

the adjusted monotone compressed file has a size, and includes a header containing data representing the size of the adjusted monotone compressed file, the size of the compressed file and the location of the second contiguous portion;

the allocating step comprises the step of reading the header to determine the size of the compressed file, and allocating a block of memory equal to the size of the decompressed file;

the storing step comprises the steps of:

reading the header to determine the size of the adjusted monotone compressed file;

calculating a location in the allocated block of memory buffer for the beginning of the adjusted monotone compressed file form the sizes of the adjusted monotone compressed file from the sizes of the adjusted monotone compressed file and the size of the decompressed file; and storing the adjusted monotone compressed file in the allocated block of memory buffer beginning at the calculated location; and the decompressing step comprises the steps of:

reading the header to determine the location of the second contiguous portion;

setting an input pointer to the calculated location in the allocated block of memory buffer for the beginning of the adjusted monotone compressed file;

setting the output pointer to the beginning of the allocated block of memory buffer;

reading a codeword from the location in the memory buffer pointed to by the input pointer and advancing the input pointer;

decoding the codeword to produce plain text;

writing the plain text to the location in the memory buffer pointed to by the output pointer and advancing the output pointer;

repeating the reading, decoding and writing steps until the input pointer corresponds to the location of the beginning of the second contiguous portion.

4. A method for compressing a source file having a size, into an adjusted monotone compressed file comprising the steps of:

a) compressing the source file into a compressed file containing compression codewords;

b) decompressing the compressed file according to an algorithm including:

c) allocating a block of memory the size of the decompressed file;

d) placing the compressed file in the last-most memory locations of said allocated block;

e) sequentially decompressing codewords of the compressed file and sequentially storing decompressed codewords in said allocated block starting at the first-most memory locations until a decompressed codeword overwrites a compressed codeword stored in said last-most memory locations which has not been decompressed;

f) determining the location in the compressed file, at which a decompressed codeword overwrites a compressed codeword which has not been decompressed, if overwriting occurs;

g) forming a monotone compressed file including compressed codewords corresponding to compressed codewords in said commpressed file preceding said location, and including plaintext codewords corresponding to compressed codewords in said compressed file following said location; and h) attaching an indicia corresponding to said location to said monotone compressed file.

5. The method of claim 4 wherein the steps c–f are simulated decompression steps.

6. The method of claim 4 further comprising the step of adding a header to the compressed file, said header containing data representing the size of the source file, the size of the adjusted compressed file, and said indicia.

* * * * *